United States Patent [19]

Watanabe

[11] Patent Number: 4,939,039
[45] Date of Patent: Jul. 3, 1990

[54] FLEXIBLE BASE MATERIALS FOR PRINTED CIRCUITS AND METHOD OF MAKING SAME

[75] Inventor: Hisashi Watanabe, Fukuoka, Japan

[73] Assignee: Nippon Steel Chemical Co., Ltd., Tokyo, Japan

[21] Appl. No.: 205,396
[22] PCT Filed: Sep. 25, 1987
[86] PCT No.: PCT/JP87/00698
  § 371 Date: May 27, 1988
  § 102(e) Date: May 27, 1988
[87] PCT Pub. No.: WO88/02591
  PCT Pub. Date: Apr. 7, 1988

[30] Foreign Application Priority Data
  Sep. 29, 1986 [JP] Japan .................. 61-228384
  Nov. 20, 1986 [JP] Japan .................. 61-275325

[51] Int. Cl.⁵ .................. B32B 15/08; B32B 27/06
[52] U.S. Cl. .................. 428/458; 428/473.5; 428/901
[58] Field of Search .................. 428/473.5, 458, 901, 428/457

[56] References Cited
  FOREIGN PATENT DOCUMENTS
  60-99133  6/1985  Japan .................. 428/473.5
  61-152733 7/1986  Japan .................. 428/473.5

OTHER PUBLICATIONS

Electro Technology, vol. 84, No. 4, Oct. 1969, p. 25; "Polyamide–imide coat bears copper foil wires".
English translation of Japanese Pat. No. 49/129864, publication date Dec. 12, 1974, 3 pp., Ishitsuka.
Kanda et al., English translation of Japanese Pat. No. 60/99133, publication date 6/3/85, one page, the claim.
Waki et al., English translation of Japanese Pat. No. 61/152733, published 7-1986, 4 pp.

Primary Examiner—Thomas J. Herbert
Attorney, Agent, or Firm—Armstrong, Nikaido, Marmelstein, Kubovcik & Murray

[57] ABSTRACT

The flexible base materials for printed circuits contain, as an insulator, resins of low thermal expansivity having structural units of the general formula (I)

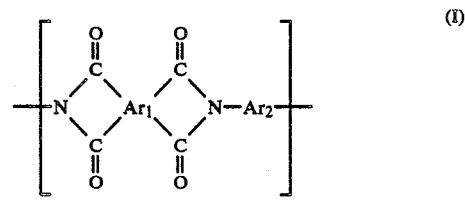

in which $Ar_1$ is a tetravalent aromatic radical, $Ar_2$ is

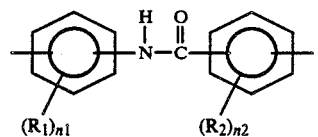

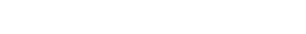

or

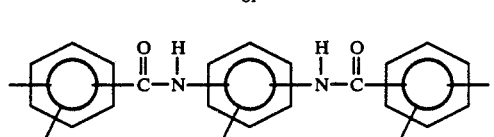

$R_1$ to $R_8$ are lower alkyl groups, lower alkoxy groups, or halogen atoms, identical with or different from each other, and n1 to n8 are integers of from 0 to 4.

The flexible base materials for printed circuits curl very little, and possess sufficient adhesive strength, flexibility and dimensional stability.

6 Claims, No Drawings

FLEXIBLE BASE MATERIALS FOR PRINTED CIRCUITS AND METHOD OF MAKING SAME

TECHNICAL FIELD

This invention relates to flexible base materials for printed circuits and a method of making them.

BACKGROUND ART

Flexible base materials for printed circuits or flat electrical cables (hereinafter referred to as flexible base materials) are usually prepared by bonding an electrical conductor and an organic polymer insulator with an adhesive. However, a thermal hysteresis from contact bonding under heat or the like during the bonding operation has posed a number of problems. One of such problems is that a base material while cooling curls, twists, or wraps because of the difference in linear expansion coefficient between the conductor and the insulator, which seriously interferes with the subsequent conductor patterning. Another is the lowering of flame retardancy caused by the presence of an adhesive layer between the conductor and the insulator. Still another problem is a high production cost of flexible base materials on account of polyimide films in use being costly and the bonding operation time-consuming.

A number of adhesive-free method have been devised in order to solve the problems arising from the use of adhesives. For example, Japanese Kokai Document No. 81-94,689 proposes to coat a conductor directly with an organic polymer solution. These methods have indeed solved the problem of the adhesive-related lowering of flame retardancy, but still left unsolved the problems of occurrence of curling from the difference in linear expansion coefficient between the conductor insulator and the subsequent interference with the conductor patterning.

Japanese Kokai Document No. 81-23,791 consequently proposes to coat a metal foil with a solution of polyamideimides and apply a heat treatment to correct the curling after drying caused by the difference in linear expansion coefficient. This method, however, is also time-consuming and poor in productivity.

Other methods disclosed in Japanese Kokai Document Nos. 85-157,286 and 85-243,120 propose to make flexible base materials of minimal curling by forming resins of low thermal expansion on a conductor from a solution of polyimides or their precursors of a specific structure. The resin films formed on the conductor, however, show some shortcomings in properties, particularly in flexibility to withstand bending, and flexible printed circuits manufactured therefrom show too large thermal shrinkage and insufficient dimensional stability when immersed in a soldering bath.

An object of this invention is to provide a method of making commercially useful flexible base materials which have as little differences as possible in linear expansion coefficient between a conductor and an insulator, do not curl, twist or wrap on application of a thermal hysteresis, and possess sufficient adhesive strength, flexibility, and dimensional stability.

The present inventors studied the aforesaid problems from various angles, found that the use of polyamideimides of a specific structure as insulator yields commercially useful flexible base materials which do not curl, twist, or wrap with a change in temperature and possess good flexibility and small thermal shrinkage, and completed this invention.

DISCLOSURE OF THE INVENTION

This invention provides flexible base materials for printed circuits comprising at least a conductor and an insulator, said insulator being resins of low thermal expansivity containing structural units of the general formula (I),

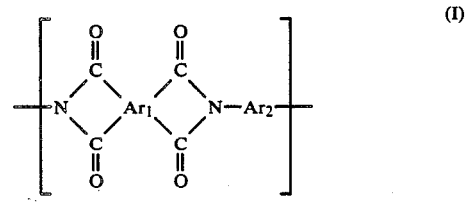

in which $Ar_1$ is a tetravalent aromatic radical, $Ar_2$ is

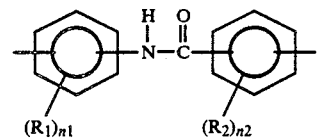

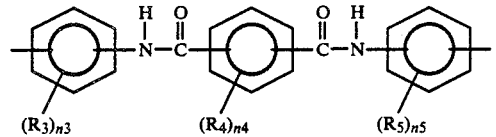

or

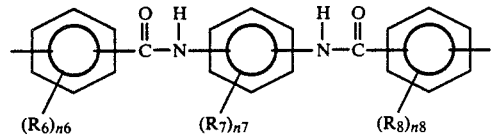

the substituents $R_1 \sim R_8$ are lower alkyl groups, lower alkoxy groups, or halogen atoms, identical with or different from each other, and the subscripts $n1 \sim n8$ are integers of from 0 to 4 provided that said $Ar_2$ has at least one lower alkoxy substituent pendant therefrom. This invention also provides a method of making said base materials by coating the conductor directly with a solution of the precursors of said resins containing structural units of the general formula (I) and curing said precursors.

The insulators of this invention, namely the resins of low thermal expansivity containing the structural units of the general formula (I), are prepared by curing polyamideimide precursors containing structural units of the general formula (IV),

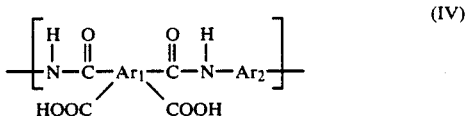

in which $Ar_1$ is a tetravalent aromatic radical, $Ar_2$ is

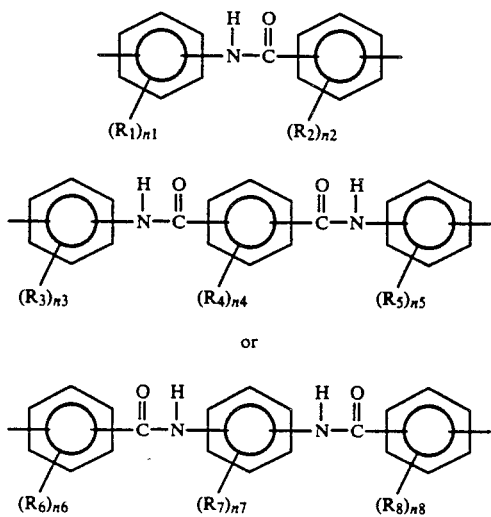

the substituents $R_1 \sim R_8$ are lower alkyl groups, lower alkoxy groups, or halogen atoms, identical with or different from each other, and the subscripts $n1 \sim n8$ are integers of from 0 to 4 provided that said $Ar_2$ has at least one lower alkoxy substituent pendant therefrom. The polyamideimide precursors containing the structural units of the general formula (IV) are obtained by the reaction of diamines of the general formula (V), (VI), or (VII),

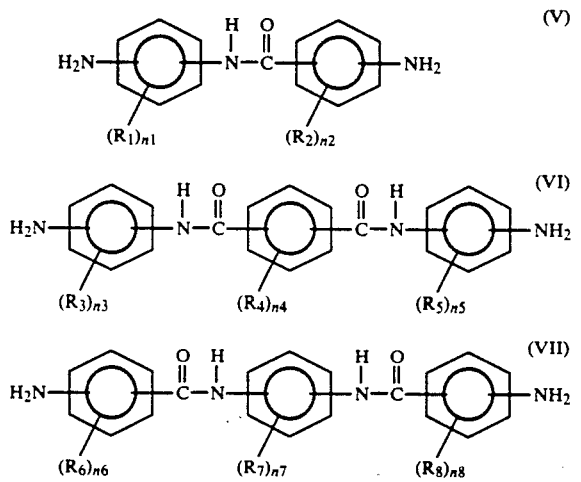

in which $R_1 \sim R_8$ and $n1 \sim n8$ are as defined for the general formula (I), with aromatic tetracarboxylic acids of the general formula (VIII) or their derivaties,

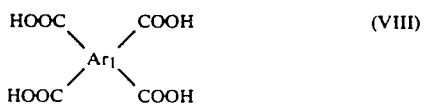

in which $Ar_1$ is a tetravalent aromatic radical.

In the diamines of the formula (V), (VI), or (VII), the substituents $R_1 \sim R_8$ are alkyl or alkoxy groups having 10 or less, preferably 5 or less, carbon atoms or are halogen atoms. Preferred examples are methyl, ethyl, propyl, methoxy, ethoxy, propoxy, fluorine, chlorine, and bromine. These substituents may be identical with or different from each other. The subscripts $n1 \sim n8$ are integers of from 0 to 4, preferably they are 0 or 1, and more preferably $n1+n2$, $n3+n4+n5$, or $n6+n7+n8$ is either 1 or 2. The diamines of the general formula (V), (VI), or (VII) may be used singly or in a mixture of two or more.

Typical examples of the aforesaid diamines include 4,4'-diaminobenzanilide, 4,3'-diaminobenzanilede, 3,4'-diaminobenzanilide, bis-N,N'-(4-aminobenzoyl)-1,4-diaminobenzene, bis-N,N'-(3-aminobenzoyl)-1,4-diaminobenzene, bis-N,N'-(4-aminobenzoyl)-1,3-diaminobenzene, bis-N,N'-(3-aminobenzoyl)-1,3-diaminobenzene, 4,4'-diaminoterephthalanilide, 4,4'-diaminoisophthalanilide, 3,3'-diaminoterephthalanilide, 3,3'-diaminoisophthalanilide, 3,4'-diaminoterephthalanilide, 3,4'-diaminoisophthalanilide, and their derivatives, most preferred being 4,4'-diaminobenzanilide derivatives having at least one methoxy group at the position ortho to the benzene ring adjacent to the amide linkage. The introduction of at least one methoxy group to the ortho position on the benzene ring adjacent to the amide linkage strengthens adhesion and reduces moisture absorption, which contributes to elimination of blistering and peeling between the conductor and the insulator and makes unnecessary the preliminary drying before the soldering operation. Examples of such 4,4'-diaminobenzanilide derivatives are 2-methoxy-4,4'-diaminobenzanilide, 2'-methoxy-4,4'-diaminobenzanilide, 2,2'-dimethoxy-4,4'-diaminobenzanilide, 2,6-dimethoxy-4,4'-diaminobenzanilide, 2,6'-dimethoxy-4,4'-diaminobenzanilide. Preferred examples are 2-methoxy-4,4'-diaminobenzanilide and 2'-methoxy-4,4'-diaminobenzanilide, with the former more desirable for ease of polymer synthesis.

In the aforesaid aromatic tetracarboxylic acids of the general formula (VIII) or their derivatives, $Ar_1$ represents tetravalent aromatic radicals such as

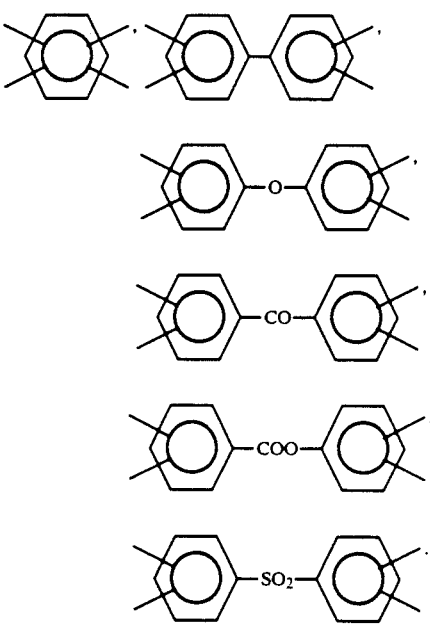

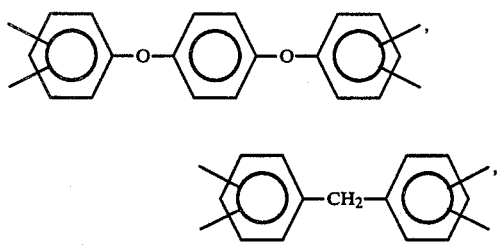

or their alkyl-substituted derivatives and preferably Ar₁ is

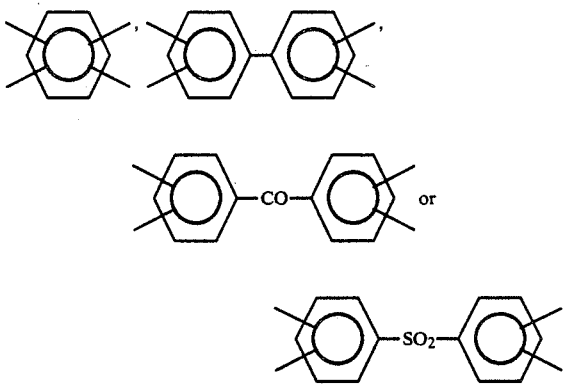

Examples of such aromatic tetracarboxylic acids of the general formula (VIII) or their derivatives include pyromellitic acid, 3,3',4,4'-biphenyltetracarboxylic acid, 3,3',4,4'-benzophenonetetracarboxylic acid, or their derivatives such as esters, acid anhydrides, and acid chlorides. Pyromellitic dianhydride is desirable for producing the low thermal expansion effect and a mixture of two or more tetracarboxylic acid dianhydride may be used for the purposes of improving properties or enhancing adhesion. The acid anhydrides are advantageous for ease of polymer synthesis and absence of harmful by-products.

The resins of low thermal expansivity desirable for the insulators of theis invention are those containing structual units of the general formula (II)

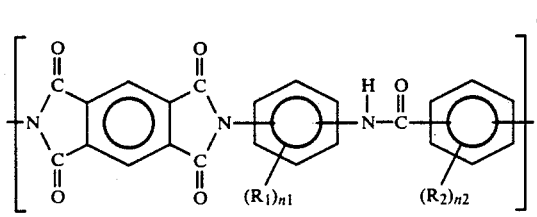

in which $R_1$, $R_2$, n1 and n2 are as defined for the general formula (I) and at least one of $(R_1)n1$ and $(R_2)n2$ is methoxy and preferably are those containing the structural unit of the following formula (III),

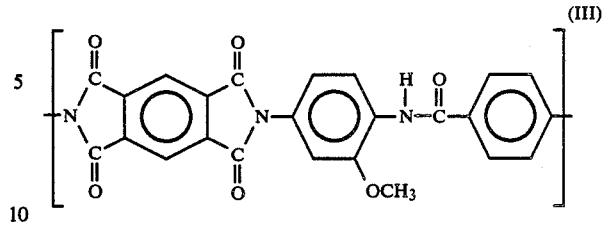

obtained from 2-methoxy-4,4'-diaminobenzanilide and pyromellitic acid or its derivative.

In the general formulas (I) to (III), the substituents $R_1 \sim R_8$ and the subscripts $n1 \sim n8$ correspond to those of the diamines of the general formulas (V) to (VII) and Ar₁ of the general formula (I) corresponds to Ar₁ of the aromatic tetracarboxylic acids of the general formula (VIII) or their derivatives.

The synthesis of the resins is carried out generally in a solvent such as N-methylpyrrolidone (NMP), N,N-dimethylformamide (DMF), N,N-dimethylacetamide (DMAc), dimethyl sulfoxide (DMSO), dimethyl sulfate, sulfolane, butyrolactone, cresol, phenol, a halogenated phenol, cyclohexanone, dioxane, tetrahydrofuran, and diglyme at from 0° to 200° C., preferably from 0° to 100° C. If the reaction temperature exceeds 200° C., the imidation reaction sometimes takes place during the polymerization reaction, which would counteract the thermal expansion effect of this invention and markedly downgrade moldability. According to this invention, it is possible to coat the conductor directly with a solution containing the polyamideimide precursors.

It is desirable for the resins of this invention to contain 30 mole % or more, preferably 50 mole % or more, of the structural units of the general formula (I). The low thermal expansion effect will be much less pronounced with less than 30 mole % of the structural units of the general formula (I).

The remaining structural units may be provided by copolymerization with diamines, tetracarboxylic acids, tricarboxylic acids, or their derivatives or blending with separately synthesized polyimides or their precursors or polyamideimides.

Examples of such diamines include p-phenylenediamine, m-phenylenediamine, 4,4'-diaminodiphenyl ether, 4,4'-diaminodiphenylmethane, 3,3'-dimethyl-4,4'-diaminodiphenylmethane, 2,2'-bis[4-(4-aminophenoxy)phenyl]propane, 1,2-bis(anilino)ethane, diaminodiphenyl sulfone, diaminobenzoate, diaminodiphenyl sulfide, 2,2-bis(p-aminophenyl)propane, 2,2-bis(p-aminophenyl)hexafluoropropane, 1,5-diaminonaphthalene, diaminotoluene, diaminobenzotrifluoride, 1,4-bis(p-aminophenoxy)benzene, 4,4'-bis(p-aminophenoxy)biphenyl, diaminoanthraquinone, 4,4'-bis(3-aminophenoxyphenyl)diphenyl sulfone, 1,3-bis(anilino)hexafluoropropane, 1,4-bis(anilino)octafluorobutane, 1,5-bis(anilino)decafluoropentane, 1,7-bis(anilino)tetradecafluoroheptane, diaminosiloxanes of the general formula

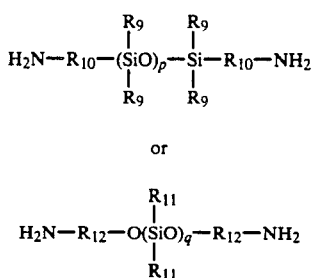

or

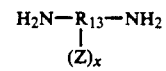

wherein $R_{10}$ and $R_{12}$ are divalent organic radicals, $R_9$ and $R_{11}$ are monovalent organic radicals, and p and q are integers greater than unity, 2,2-bis[4-(p-aminophenoxy)phenyl]hexafluoropropane,
2,2-bis[4-(3-aminophenoxy)phenyl]hexafluoropropane,
2,2-bis[4-(2-aminophenoxy)phenyl]hexafluoropropane,
2,2-bis[4-(4-aminophenoxy)-3,5-dimethylphenyl]hexafluoropropane,
2,2-bis[4-(4-aminophenoxy)-3,5-ditrifluoromethylphenyl]hexafluoropropane,
p-bis(4-amino-2-trifluoromethylphenoxy)benzene,
4,4'-bis(4-amino-2-trifluoromethylphenoxy)biphenyl,
4,4'-bis(4-amino-3-trifluoromethylphenoxy)biphenyl,
4,4'-bis(4-amino-2-trifluoromethylphenoxy)diphenyl sulfone,
4,4'-bis(3-amino-5-trifluoromethylphenoxy)diphenyl sulfone,
2,2-bis[4-(4-amino-3-trifluoromethylphenoxy)phenyl]hexafluoropropane, benzidine, 3,3',5,5'-tetramethylbenzidine, octafluorobenzidine, 3,3'-dimethoxybenzidine, o-tolidine, m-tolidine, 2,2',5,5'6,6'-hexafluorotolidine,
4,4''-diaminoterphenyl, 4,4'''-diaminoquaterphenyl, and diisocyanates obtained by the reaction of the foregoing diamines with phosgene.

Examples of the tetracarboxylic acids and their derivatives include 3,3',4,4'-biphenyltetracarboxylic acid,
3,3',4,4'-benzophenonetetracarboxylic acid,
3,3',4,4'-tetracarboxydiphenyl sulfone,
2,3,3',4'-tetracarboxydiphenyl ether,
2,3,3',4'-benzophenonetetracarboxylic acid,
2,3,6,7-naphthalenetetracarboxylic acid,
1,4,5,7-naphthalenetetracarboxylic acid,
1,2,5,6-naphthalenetetracarboxylic acid,
3,3',4,4'-diphenylmethanetetracarboxylic acid,
2,2-bis(3,4-dicarboxyphenyl)propane,
2,2-bis(3,4-dicarboxyphenyl)hexafluoropropane,
3,4,9,10-tetracarboxyperylene,
2,2-bis[4-(3,4-dicarboxyphenoxy)phenyl]propane,
2,2-bis[4-(3,4-dicarboxyphenoxy)phenyl]hexafluoropropane,
butanetracarboxylic acid, cyclopentanetetracarboxylic acid, and their corresponding esters, acid anhydrides, and acid chlorides. Trimellitic acid and its derivatives are also included.

Moreover, it is possible to introduce crosslinked structures and ladder structures by modifying the resins with compounds containing reactive functional groups as illustrated by the following examples:

1 Modification with compounds of the general formula $$H_2N-R_{13}-NH_2$$
$$(Z)_x$$

wherein $R_{13}$ is an aromatic radical having a valence of $(2+x)$, x is 1 or 2, and Z is a substituent selected from $NH_2$, $CONH_2$, and $SO_2 NH_2$ and located ortho to the amino group followed by formation of pyrrone and isoindoloquinazolinedione rings;

2 Modification with amines, diamines, dicarboxylic acids, tricarboxylic acids, or tetracarboxylic acids containing polymerizable unsaturated linkages such as maleic acid, nadic acid, tetrahydrophthalic acid, and ethynylaniline followed by curing into a crosslinked structure; and 3 Modification with aromatic amines containing phenolic hydroxyl groups or carboxyl groups followed by formation of a network structure with the aid of crosslinking agents capable of reacting with the hydroxyl or carboxyl groups.

The polyamideimide insulators of this invention can be controlled in their linear expansion coefficient by any of the above-mentioned modifications. The polyamideimides containing exclusively the structural units of the general formula (I) can be molded into insulators having a linear expansion coefficient of $1 \times 10^{-5}(K^{-1})$ or less inside the plane, which coefficient can be varied at will by the aforesaid modifications. The polyamideimides can also be modified for the purposes of improving other properties such as adhesive strength and flexibility.

The flexible base materials of this invention are prepared by coating the conductor with a solution of the precursors of the previously modified polyamideimides. The conditions for drying off the solvent and the subsequent imidation reaction may be chosen at will. The imidation temperature may be in excess of 200° C., preferably in excess of 250° C., in the final stage. This temperature may be raised further to above the glass transition temperature of the resins without difficulty.

The flexible base materials of this invention comprise at least a conductor and an insulator. Examples of the conductor include copper, aluminium, iron, silver, palladium, nickel, chromium, molybdenum, tungsten, and their alloys. Copper is preferable and, cost-wise, electrolytic copper foils are most desirable. In general, an electrolytic copper foil tends to curl more than a rolled copper foil when coated with the resin solution, but the flexible base materials of this invention are free of curling even when electrolytic copper foils are used.

The conductor may be plated with nickel or treated chemically by such agents as aluminum alcoholates, aluminum chelates, and silane coupling agents or mechanically by sanding. Moreover, the conductor may be provided with an adhesive layer in advance. The conductor may be present in a single layer or multiple layers. The insulator is provided adjacent to the conductor layer or layers, occasionally with an intermediate adhesive layer, but the insulator of this invention constitutes at least one of the insulator layers.

With the use of an insulator having a linear expansion coefficient of $1.7 \times 10^{-5}(K^{-1})$ or less and sufficiently flexible to withstand 5,000 or more bendings, it is possible to prepare industrially useful flexible base materials which do not curl, twist, or warp on application of a thermal hysteresis and show sufficient flexibility, dimentional stability, and adhesion.

The insulators of this invention may be mixed with inorganic or organic powders, fibers, chopped strands and the like in order to lower the linear expansion coefficient, raise the modulus, control the fluidity, or reduce the cost.

It is possible to apply an adhesive to the resin side of the flexible base materials and paste a copper foil to form flexible base materials clad on both sides with copper foils.

The flexible base materials of this invention retain the mechanical properties of the conventional polyamideimides, and yet do not curl. Also, the method of this invention enables coating of the conductor with a solution of the polyamideimide precursors without an intermediate adhesive layer. Compared with the known methods of bonding a preformed film and a conductor with an adhesive, the method of this invention does not require the bonding step, thus allowing considerable process simplification, and is set free from the problem of lowered heat resistance and flame retardancy caused by the use of low-temperature curable adhesives.

Furthermore, the flexible base materials of this invention show strong adhesion between the conductor and the insulator and produce extremely small dimensional changes or heat shrinkage in etching or soldering of the conductor and, for their low linear expansion coefficients, they can be readily applied to the manufacture of multilayer circuits or composites with rigid circuits.

As was described above, the flexible base materials of this invention curl very little due to a small thermal expansion coefficient of the insulator, possess sufficient adhesive strength, flexibility, and dimensional stability, can be made by direct coating of the conductor with the insulator, and do not require the heat treatment for uncurling, which all contribute to make process simplification and industrial usefulness.

PREFERRED EMBODIMENTS OF THE INVENTION

This invention is explained with reference to the accompanying examples and comparative examples, but is not limited thereto.

The linear expansion coefficient was determined on a fully imidated sample with the aid of a thermomechanical analyzer (TMA) by heating the sample to 250° C., then cooling it at a rate of 10° C. per minute, and calculating the average linear expansion coefficient between 240° and 100° C.

The adhesive strength was determined with the aid of a Tensilon tester by fixing the resin side of a 10 mm wide copper-resin sample to an aluminum plate by means of a double-coated adhesive tape and peeling the copper in the 180° C. direction.

The moisture absorption was determined by immersing a resin sample in water at room temperature for 24 hours and measuring the change in weight before and after the immersion.

The flexibility test for tolerance to bending was performed on a resin sample, 10 mm in width and 25 μm in thickness, with the use of an MIT crease-flex fatigue tester manufactured by Toyo Seiki Seisakusho, Ltd.

The dimentional change after etching was determined by etching a copper-resin sample, 10 mm wide and 150 mm long, with an aqueous solution of ferric chloride, washing the etched sample with water, drying it at 100° C., and measuring the difference in length before and after the etching.

The soldering resistance was evaluated by immersing a copper-resin sample pre-conditioned at 76% relative humidity for 24 hours in a soldering bath at 260° C. for 10 seconds and observing the sample for any occurrence of blistering and peeling.

The heat shrinkage was determined by etching the copper from a copper-resin sample, immersing the resulting resin film, 10 mm wide and 150 mm long, in a soldering bath at 260° C. for 1 minute, and measuring the dimentional change before and after the immersion.

The following symbols are used in the examples and comparative examples.

PMDA: Pyromellitic acid dianhydride
BPDA: 3,3',4,4'-Biphenyltetracarboxylic acid dianhydride
BTDA: 3,3',4,4'-Benzophenonetetracarboxylic acid dianhydride
DDE: 4,4'-Diaminodiphenyl ether
DDM: 4,4'-Diaminodiphenylmethane
o-TLDN: o-Tolidine

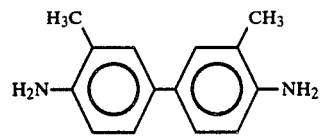

DABA: 4,4'-Diaminobenzanilide

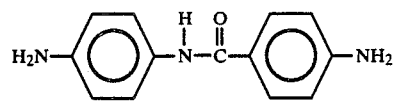

Mt-DABA: 2'-Methyl-4,4'-diaminobenzanilide

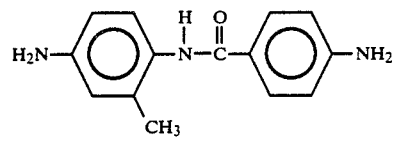

Cl-DABA: 2'-Chloro-4,4'-diaminobenzanilide

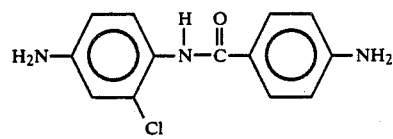

2'-Mo-DABA: 2'-Methoxy-4,4'-diaminobenzanilide

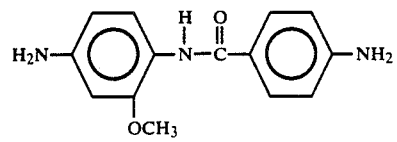

2-Mo-DABA: 2-Methoxy-4,4'-diaminobenzanilide

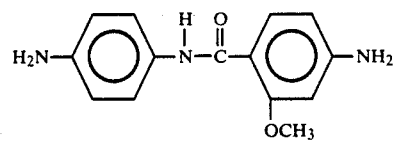

2,2'-dMo-DABA: 2,2'-Dimethoxy-4,4'-diaminobenzanilide

-continued

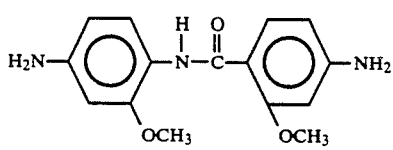

BATA: 4,4'-Diaminoterephthalanilide

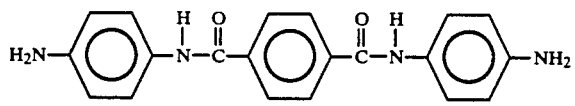

BAPA: Bis-N,N'-(4-aminobenzoyl)-1,4-diaminobenzene

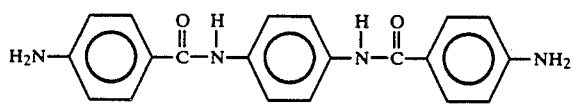

DMAc: Dimethlacetamide
NMP: N-Methyl-2-pyrrolidone

EXAMPLE 1

Into a 300 ml four-mounted flask equipped with a thermometer, a calcium chloride drying tube, a stirring rod, and a nitrogen inlet tube were introduced 0.085 mole of DABA, 0.015 mole of DDE, and 170 ml of DMAc and stirred in a stream of nitrogen flowing at a rate of 200 ml per minute. The DABA did not dissolve. However, when the solution was cooled to below 10° C. in a cold water bath and 0.1 mole of PMDA was added slowly, the DABA dissolved slowly and reacted to give a viscous solution of polyamic acids (polyamideimide precursors).

An 18 μ thick electrolytic copper foil fixed on an aluminum plate was coated with the polyamic acid solution to result in a thickness of about 25 μm, preliminarily dried in forced-ventilation ovens at 130° C. for 10 minutes and then at 150° C. for 10 minutes, then heated to 330° C. over 15 minutes to effect the imidation. The flexible copper-resin base material showed a reverse curl of a curvature of 20 mm or so with the copper foil lying inside. A curl of this magnitude presents no problem in practical use.

A polyamideimide film obtained by etching the copper with a solution of ferric chloride showed a linear expansion coefficient of $1 \times 10^{-6}(K^{-1})$, withstood 15,000 or more bendings in the flexibility test, and was acceptable to practical use.

EXAMPLE 2

As in Example 1, 0.075 mole of DABA, 0.025 mole of DDE, and 0.1 mol of PMDA were polymerized in 170 ml of DMAc. A flexible base material prepared from the resulting resin and a copper foil showed a slight reverse curl. Etching of the copper gave a polyamideimide film of a curvature of 10 mm or so with the etched face lying inside. The film showed a linear expansion coefficient of $3 \times 10^{-6}(K^{-1})$ and heat shrinkage of less than 0.1% and withstood 20,000 or more bendings in the flexibility test. A part from the above, a glass plate was coated with the polymer solution by an applicator to result in a thickness of about 25 μm and preliminarily dried in a forced-ventilation oven at 150° C. for 10 minutes, then the film was peeled off and left tension-free in a hot air circulation oven at 330° C. for 15 minutes. The film showed a linear expansion coefficient of $16 \times 10^{-6}(K^{-1})$.

EXAMPLE 3

As in Example 1, 0.055 mole of DABA, 0.045 mole of DDE, and 0.1 mole of PMDA were polymerized in 170 ml of DMAc. A flexible material from the resin and a copper foil showed a regular curl of a curvature of 20 mm with the resin film lying inside. A curl of this magunitude is no problem in practical use. A polyamideimide film obtained by etching the copper showed a linear expansion coefficient of $10 \times 10^{-6}(K^{-1})$ and heat shrinkage of less than 0.1% and withstood 20,000 or more bendings in the flexibility test.

EXAMPLE 4

As in Example 1, 0.1 mole of DABA, 0.08 mole of PMDA, and 0.02 mole of BTDA were polymerized in 170 ml of DMAc. A flexible base material prepared from the resin and a copper foil was substantially flat. A polyamideimide film obtained by etching the copper showed a linear expansion coefficient of $6 \times 10^{-6}(K^{-1})$ and heat shrinkage of less than 0.1% and withstood 20,000 or more bendings in the flexibility test.

EXAMPLE 5

As in Example 1, 0.1 mole of DABA and 0.1 mole of BPDA were polymerized in 170 ml of DMAc. A flexible base material prepared from the resin and a copper foil showed a regular curl of a curvature of 15 mm. A polyamideimide film obtained by etching the copper showed a linear expansion coefficient of $12 \times 10^{-6}(K^{-1})$ and heat shrinkage of 0.15%, withstood 12,000 bendings in the flexibility test, and was acceptable to practical use.

EXAMPLE 6

As in Example 1, 0.07 mole of Mt-DABA, 0.03 mole of DDE, and 0.1 mole of PMDA were polymerized in 170 ml of DMAc. A flexible base material prepared from the resin and a copper foil was substantially flat and a resin film obtained therefrom showed a linear expansion coefficient of $8 \times 10^{-6}(K^{-1})$ and heat shrinkage less than 0.1% and withstood 20,000 or more bendings in the flexibility test.

EXAMPLE 7

As in Example 1, 0.065 mole of BATA, 0.035 mole of DDE, and 0.1 mole of PMDA were polymerized in 170 ml of DMAc. A flexible base material prepared from the resin and a copper foil was substantially flat and a resin film obtained therefrom showed a linear expansion coefficient of $8 \times 10^{-6}(K^{-1})$ and heat shrinkage of less than 0.1% and withstood 20,000 or more bendings in the flexibility test.

EXAMPLE 8

As in Example 1, 0.065 mole of BAPA, 0.035 mole of DDE, and 0.1 mole PMDA were polymerized in 170 ml of DMAc. A flexible base material prepared from the resin and a copper foil was substantially flat and a resin film obtained therefrom showed a linear expansion coefficient of $9 \times 10^{-6}(K^{-1})$ and heat shrinkage of less than 0.1% and withstood 20,000 or more bendings in the flexibility test.

EXAMPLE 9

As in Example 1, 0.1 mole of 3,4'-diaminobenzanilide (3,4'-DABA) and 0.1 mole of PMDA were polymerized in 170 ml of DMAc. A flexible base material prepared from the resin and a copper foil was substantially flat and a resin film obtained therefrom by etching showed a linear expansion coefficient of $5 \times 10^{-6}(K^{-1})$ and heat shrinkage of 0.1% or less and withstood 20,000 or more bendings in the flexibility test.

EXAMPLE 10

A copper foil coated with the resin prepared as in Example 2 was subjected to the imidation reaction in a hot air circulation oven at 400° C. for 15 minutes. A resin film obtained by etching of the copper slightly curled with the etched side lying inside.

EXAMPLES 11~13

As in Example 1, 0.075 mole of DABA, Mt-DABA, or Cl-DABA was polymerized with 0.075 mole of PMDA in 170 ml of DMAc. Flexible base materials prepared from the resins and copper foils were substantially flat and resin films obtained therefrom showed a linear expansion coefficient $(5 \sim 10) \times 10^{-6}(K^{-1})$ and heat shrinkage of less than 0.1%. The films in Examples 11 and 12 withstood 20,000 or more bendings in the flexibility test while that in Example 13 withstood 10,000 bendings.

COMPARATIVE EXAMPLE 1

As in Example 1, 0.1 mole of DDE and 0.098 mole of PMDA were polymerized in 170 ml of DMAc. A flexible base material prepared from the resin and a copper foil showed a strong regular of a curvature of 5 mm or so. A resin film obtained therefrom by etching showed a linear expansion coefficient of $27 \times 10^{-6}(K^{-1})$ and heat shrinkage of less than 0.1% and withstood 20,000 or more bendings in the flexibility test.

COMPARATIVE EXAMPLE 2

As in Example 1, 0.1 mole of O-TLDN and 0.1 mole of PMDA were polymerized in 170 ml of DMAc. A flexible base material prepared from the resin and a copper foil showed a strong regular curl of a curvature of 10 mm or so. A resin film obtained therefrom by etching showed a linear expansion coefficient of $20 \times 10^{-6}(K^{-1})$ and heat shrinkage of 0.5% and withstood only 200 bendings in the flexibility test.

COMPARATIVE EXAMPLE 3

A solution containing the resin obtained in Example 2 was mixed with twice its number of moles each of pyridine and acetic anhydride and heated at 50° C. for 5 hours to effect the imidation reaction. The resulting solution solidfied into a rubber mass and was difficult to apply uniformly to copper foils.

COMPARATIVE EXAMPLE 4

As 18 μm thick electrolytic copper foil fixed on an aluminum plate was coated with a commerically available polyamideimide varnish (solid content 30% by weight, solvent NMP) prepared from trimellitic anhydride (ATMA) and 4,4'-diaminodiphenylmethane (DDM) to result in a thickness of about 25 μm by an applicator, preliminarily dried in a forced-ventilation oven at 180° C. for 10 minutes, and then left in a hot air circulation oven at 330° C. for 15 minutes. The resulting flexible base material showed a strong regular curl of a curvature of 5 mm or so. A resin film therefrom showed a linear expansion coefficient of $35 \times 10^{-6}(K^{-1})$.

The results of the evaluation of Examples 1, 2, and 4 are shown in Table 1.

TABLE 1

| | Diamine Compound | | Acid Anhydride | | Curl Curvature (mm) | Linear Expansion Coefficient ($\times 10^{-6} K^{-1}$) | Heat Shrinkage (%) | Flexibility ($\times$ 1000 Bendings) |
|---|---|---|---|---|---|---|---|---|
| | Kind | Mole | Kind | Mole | | | | |
| Example 1 | DABA | 0.085 | PMDA | 0.10 | 20 | 1 | <0.1 | 15 |
| | DDE | 0.015 | | | Reverse Curl | | | |
| Example 2 | DABA | 0.075 | PMDA | 0.10 | Substantially Flat | 3 | <0.1 | 20< |
| | DDE | 0.025 | | | | | | |
| Example 3 | DABA | 0.055 | PMDA | 0.10 | 20 | 10 | <0.1 | 20< |
| | DDE | 0.045 | | | | | | |
| Example 4 | DABA | 0.100 | PMDA | 0.08 | Substantially Flat | 6 | <0.1 | 20< |
| | | | BTDA | 0.02 | | | | |
| Example 5 | DABA | 0.100 | BPDA | 0.10 | 15 | 12 | 0.15 | 12 |
| Example 6 | Mt-DABA | 0.070 | PMDA | 0.10 | Substantially Flat | 8 | <0.1 | 20< |
| | DDE | 0.030 | | | | | | |
| Example 7 | BATA | 0.065 | PMDA | 0.10 | Substantially Flat | 8 | <0.1 | 20< |
| | DDE | 0.035 | | | | | | |
| Example 8 | BAPA | 0.065 | PMDA | 0.10 | Substantially Flat | 9 | <0.1 | 20< |
| | DDE | 0.035 | | | | | | |
| Example 9 | 3,4'-DABA | 0.1 | PMDA | 0.10 | Substantially Flat | 5 | <0.1 | 20< |
| Example 11 | DABA | 0.075 | PMDA | 0.075 | Substantially Flat | 5 | <0.1 | 20< |
| | DDE | 0.025 | BTDA | 0.025 | | | | |
| Example 12 | Mt-DABA | 0.075 | PMDA | 0.075 | Substantially Flat | 10 | <0.1 | 20< |
| | DDE | 0.025 | BTDA | 0.025 | | | | |
| Example 13 | Cl-DABA | 0.075 | PMDA | 0.075 | Substantially Flat | 10 | <0.1 | 10 |
| | DDE | 0.025 | BTDA | 0.025 | | | | |
| Comparative Example 1 | DDE | 0.100 | PMDA | 0.98 | 5 | 27 | <0.1 | 20< |
| Comparative Example 2 | o-TLDN | 0.100 | PMDA | 0.10 | 10 | 20 | 0.5 | 0.2 |
| Comparative Example 4 | DDM | | ATMA | | 5 | 35 | 1.0 | 20< |

EXAMPLE 14

Into a 300 ml of four-mouthed flask equipped with a thermometer, a calcium chloride drying tube, a stirring rod, and a nitrogen inlet tube were introduced 0.075 mole of 2-Mo-DABA and 170 ml of DMAc and stirred in a stream of nitrogen flowing at a rate of 200 ml per minute. The 2-Mo-DABA did not dissolve completely. However, when the solution was cooled to below 10° C. in a cold water bath and 0.075 mole of PMDA was added slowly, the 2-Mo-DABA dissolved slowly and reacted.

After about 20 minutes of the reaction, 0.025 mole of DDE, 0.025 mole of BTDA, and 50 ml of DMAc were added. The reaction was allowed to proceed with stirring at room temperature for about 2 hours to yield a block copolymer (polyamideimide precursor).

The solution containing the copolymer was applied by an applicator to a commerically available electrolytic copper foil (thickness 35 µm, linear expansion coefficient $1.5 \times 10^{-5} K^{-1}$) fixed on Pyrex glass to result in a thickness of about 25 µm, preliminarily dried at 130° C. for 10 minutes and then at 150° C. for 10 minutes in forced-ventilation ovens, and heated up to 330° C. over 15 minutes to effect the imidation reaction.

The resin-coated copper foil possessed an adhesive strength 1.4 kg/cm and showed no change when left at 76% relative humidity for 24 hours and then immersed in a soldering bath at 260° C. for 10 seconds. Etching of the material produced a dimensional change of less than 0.1%. The resin film remaining after the etching showed heat shrinkage of 0.1%, a linear expansion coefficient of $8 \times 10^{-6}(K^{-1})$, moisture absorption of 2.8%, and withstood 20,000 or more bendings in the flexibility test.

The ratio of the 2-Mo-DABA-PMDA blocks (x wt %) to the DDE-BTDA blocks [(100−x)wt%] in the copolymers was varied and the relationshipe between this ratio and the linear expansiion coefficient was examined. The results shown below indicate that the two are inversely proportional to each other.

| X (wt %) | Linear expansion coefficient [$\times 10^{-6} (K^{-1})$] |
|---|---|
| 0 | 55 |
| 25 | 43 |
| 50 | 16 |
| 75 | 8 |
| 85 | 3 |
| 100 | 0.5 |

EXAMPLE 15

As in Example 1, 0.090 mole of 2-Mo-DABA, 0.010 mole of DDM, and 170 ml of DMAc were introduced into a four-mouthed flask and 0.090 mole of PMDA and 0.010 mole of BTDA were added slowly with stirring and cooling. Continued stirring at room temperature for 2 hours or so gave a viscous resin solution.

A copper foil coated with the resin possessed an adhesive strength of 1.0 kg/cm and showed no anomaly when heated in a soldering bath. Etching of the material produced a dimensional change of less than 0.1% and the resin film remaining after the etching showed heat shrinkage of 0.1%, a linear expansion coefficient of $3 \times 10^{-6}(K^{-1})$, and moisture absorption of 2.8% and withstood 20,000 or more bendings in the flexibility test.

EXAMPLES 16 and 17

The polymerization was carried out as in Example 14 with the use of 2'-Mo-DABA or 2,2'-dMo-DABA in place of 2-Mo-DABA.

EXAMPLES 18 AND 19

The polymerization was carried out as in Example 15 with the use of the diamines and acids shown in Table 2.

EXAMPLE 20

A copper foil was precoated with a solution of the polyimide precursor obtained by the reaction of DDE with BTDA to result in a thickness of 2 µm and then coated with the resin solution of Example 19.

COMPARATIVE EXAMPLE 5

The polymerization of o-TLDN and BPDA effected in NMP as in Example 15 produced a resin of poor flexibility and large heat shrinkage not very reliable as an insulator for flexible base materials.

COMPARATIVE EXAMPLE 6

The polymerization of DDE and PMDA effected in DMAc as in Example 15 produced a resin which showed a greater curl due to a larger linear expansion coefficient, produced a dimentional change of 0.5% after etching, and was unsuitable for flexible base materials.

The results of the evaluation of Examples 14 to 20 and Comparative Examples 5 and 6 are shown in Table 2.

TABLE 2

| | Diamine Compound | | Acid Anhydride | | Thermal Expansion Coefficient $\times 10^{-6} (K^{-1})$ | Curl Curvature (mm) | Flexibility No. of Bendings |
|---|---|---|---|---|---|---|---|
| | Kind | Amount Used (Mole) | Kind | Amount Used (Mole) | | | |
| Example 14 | 2'-Mo-DABA | 0.075 | PMDA | 0.075 | 8 | Substantially Flat | >20,000 |
| | DDE | 0.025 | BTDA | 0.025 | | | |
| Example 15 | 2'-Mo-DABA | 0.09 | PMDA | 0.09 | 3 | Substantially Flat | >20,000 |
| | DDM | 0.01 | BTDA | 0.01 | | | |
| Example 16 | 2-Mo-DABA | 0.075 | PMDA | 0.075 | 8 | Substantially Flat | >20,000 |
| | DDE | 0.025 | BTDA | 0.025 | | | |
| Example 17 | 2,2'-dMo-DABA | 0.075 | PMDA | 0.075 | 15 | 30 | >20,000 |
| | DDE | 0.025 | BTDA | 0.025 | | | |
| Example 18 | 2'-Mo-DABA | 0.10 | PMDA | 0.10 | 1 | Substantially Flat | 10,000 |
| Example 19 | 2'-MO-DABA | 0.060 | PMDA | 0.10 | 8 | Substantially Flat | >20,000 |
| | DDE | 0.040 | | | | | |
| Example 20 | 2'-MO-DABA | 0.060 | PMDA | 0.10 | 6 | Substantially Flat | >20,000 |
| | DDE | 0.040 | | | | | |
| Comparative Example 5 | o-TLDN | 0.10 | BPDA | 0.10 | 20 | 10 | 200 |
| Comparative | DDE | 0.10 | PMDA | 0.10 | 35 | 5 | >20,000 |

TABLE 2-continued

| Example 6 | Adhesive Strength (kg/cm) | Dimensional Change after Etching (%) | Heat Shrinkage (%) | Moisture Absorption (%) | Soldering Resistance |
|---|---|---|---|---|---|
| Example 14 | 1.4 | <0.1 | 0.1 | 2.8 | good |
| Example 15 | 1.0 | <0.1 | 0.1 | 2.8 | good |
| Example 16 | 1.4 | <0.1 | 0.1 | 2.9 | good |
| Example 17 | 1.5 | <0.1 | 0.1 | 2.5 | good |
| Example 18 | 1.0 | <0.1 | 0.1 | 2.8 | good |
| Example 19 | 1.0 | <0.1 | 0.1 | 2.8 | good |
| Example 20 | 1.6 | <0.1 | 0.1 | 2.8 | good |
| Comparative Example 5 | 0.9 | 0.2 | 0.5 | 2.9 | good |
| Comparative Example 6 | 0.7 | 0.5 | 0.1 | 3.5 | good |

Industrial Applicability

The flexible base materials of this invention curl very little on account of their component insulators having small linear expansion coefficients, possess sufficient adhesive strength, flexibility, and dimensional stability, and are useful as industrial materials of high reliability. Moreover, they are manufactured in a simplified process by direct coating of the conductors without need of the heat treatment for uncurling.

What is claimed is:

1. Flexible base materials for printed circuits which comprise at least one conductor and an insulator coated thereon, said insulator containing resins of low thermal expansivity having structural units of the general formula (I)

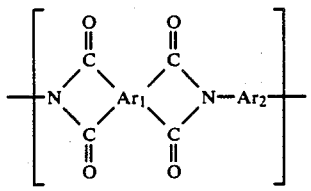

in which $Ar_1$ is a tetravalent aromatic radical, $Ar_2$ is

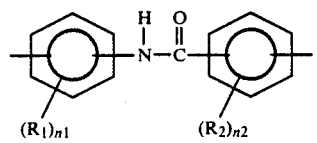

or

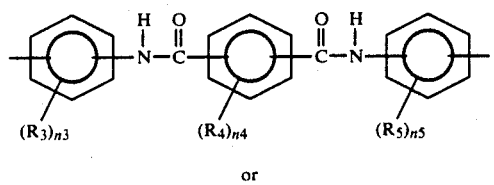

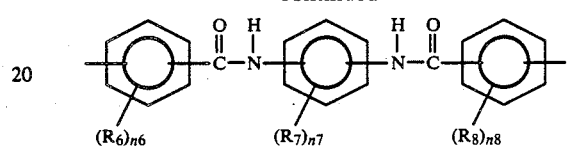

$R_1$ and $R_8$ are lower alkyl groups, lower alkoxy groups, or halogen atoms, identical with or different from each other, and n1 to n8 are each independently 0 to 4, and wherein each $Ar_2$ has at least one lower alkoxy group pendant therefrom.

2. Flexible base materials for printed circuits according to claim 1, wherein the resins of low thermal expansivity contain structural units of the general formula (II)

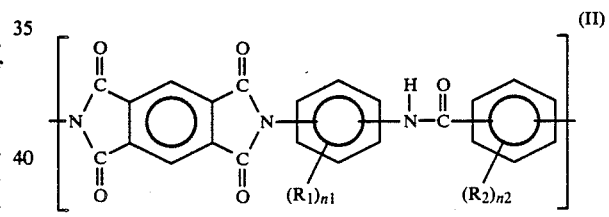

in which at least one of $(R_1)n1$ and $(R_2)n2$ is the methoxy group.

3. Flexible base materials for printed circuits according to claim 2, wherein the resins of low thermal expansivity have structural units of the following formula (III).

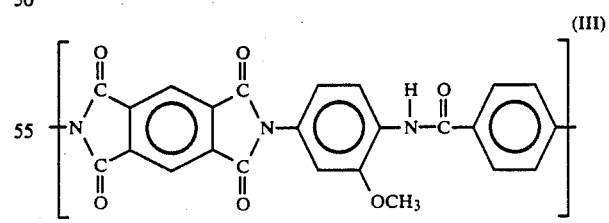

4. Flexibile base materials for printed circuits according to any one of claims 1 to 3, wherein the insulator has flexibility to withstand 5,000 or more bendings and a linear expansion coefficient of $1.7 \times 10^{-5}(K^{-1})$ or less.

5. Flexible base materials for printed circuits according to claim 4, wherein the base materials comprise only a conductor and an insulator.

6. Flexible base materials for printed circuits according to claim 5, wherein the conductor is an electrolytic copper foil.

* * * * *